United States Patent
Zheng et al.

(10) Patent No.: US 11,079,621 B2
(45) Date of Patent: Aug. 3, 2021

(54) ARRAY SUBSTRATE AND FABRICATING METHOD THEREOF, REFLECTIVE DISPLAY PANEL, AND DISPLAY DEVICE

(71) Applicants: Beijing BOE Optoelectronics Technology Co., Ltd., Beijing (CN); BOE TECHNOLOGY GROUP CO., LTD., Beijing (CN)

(72) Inventors: Qi Zheng, Beijing (CN); Lu Bai, Beijing (CN); Gang Hua, Beijing (CN); Hongliang Yuan, Beijing (CN); Peng Li, Beijing (CN); Xiaohui Lv, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/538,438

(22) Filed: Aug. 12, 2019

(65) Prior Publication Data

US 2020/0219906 A1 Jul. 9, 2020

(30) Foreign Application Priority Data

Jan. 7, 2019 (CN) .......................... 201910011725.3

(51) Int. Cl.
G02F 1/1333 (2006.01)
G02F 1/1362 (2006.01)
(Continued)

(52) U.S. Cl.
CPC ...... *G02F 1/133345* (2013.01); *G02F 1/1368* (2013.01); *G02F 1/13392* (2013.01);
(Continued)

(58) Field of Classification Search
CPC ......... G02F 1/133345; G02F 1/133553; G02F 2203/02; G02F 1/13439; G02F 1/136286;
(Continued)

(56) References Cited

U.S. PATENT DOCUMENTS 5,408,345 A * 4/1995 Mitsui ............... G02F 1/133553
349/42
5,734,455 A * 3/1998 Yoshida ................ G02F 1/1393
349/99

(Continued)

*Primary Examiner* — Jia X Pan
(74) *Attorney, Agent, or Firm* — Thomas | Horstemeyer, LLP

(57) ABSTRACT

The present disclosure provides an array substrate. The array substrate includes a base on which pixel electrodes, gate lines, data lines, and thin film transistors are disposed. The data lines and the gate lines are alternately arranged to define a plurality of pixel units one-to-one corresponding to the pixel electrodes and the thin film transistors. An insulating layer is disposed between the pixel electrodes and a layer where a data pattern is located. The data pattern, part of which is overlapped with the pixel electrodes, includes the data lines and source electrodes of the thin film transistors. The insulating layer is provided with recesses, and an orthographic projection of the recess on the base is outside of an orthographic projection of an overlapping region of the pixel electrode and the data pattern on the base.

17 Claims, 2 Drawing Sheets

(51) Int. Cl.
*G02F 1/1368* (2006.01)
*G02F 1/1335* (2006.01)
*G02F 1/1339* (2006.01)

(52) U.S. Cl.
CPC .. *G02F 1/133553* (2013.01); *G02F 1/136286* (2013.01); *G02F 1/136236* (2021.01)

(58) Field of Classification Search
CPC ........ G02F 2001/136236; G02F 2001/136295; G02F 1/133504; G02F 2203/09; G02F 1/13392; G02F 1/13394; H01L 51/5271
See application file for complete search history.

(56) References Cited

U.S. PATENT DOCUMENTS

| | | | | |
|---|---|---|---|---|
| 6,459,463 B2 * | 10/2002 | Kim | .................. | G02F 1/133553 349/110 |
| 6,731,358 B2 * | 5/2004 | Tanaka | .............. | G02F 1/133514 349/106 |
| 6,784,957 B2 * | 8/2004 | Kanou | .............. | G02F 1/133553 349/113 |
| 7,106,400 B1 * | 9/2006 | Tsuda | .................. | G02F 1/133553 349/113 |
| 2002/0118324 A1 * | 8/2002 | Tsuyuki | .............. | G02F 1/133553 349/113 |
| 2004/0070709 A1 * | 4/2004 | Kanou | .............. | G02F 1/136227 349/113 |
| 2004/0141113 A1 * | 7/2004 | Yun | ................... | G02F 1/133553 349/113 |
| 2004/0183967 A1 * | 9/2004 | Kim | ....................... | G02F 1/1368 349/113 |
| 2005/0063059 A1 * | 3/2005 | Yukawa | ........... | G02F 1/133553 359/558 |
| 2005/0190322 A1 * | 9/2005 | Okabe | ....................... | C23F 1/20 349/113 |
| 2007/0164283 A1 * | 7/2007 | Wachi | ............... | G02F 1/133553 257/59 |
| 2009/0147162 A1 * | 6/2009 | Yeom | ................ | G02F 1/133707 349/33 |
| 2010/0118238 A1 * | 5/2010 | Shimada | ........... | G02F 1/133555 349/113 |

* cited by examiner

A-A

ARRAY SUBSTRATE AND FABRICATING METHOD THEREOF, REFLECTIVE DISPLAY PANEL, AND DISPLAY DEVICE

CROSS-REFERENCE TO RELATED APPLICATIONS

The present application is based on and claims the benefit of and priority to Chinese Patent Application No. 201910011725.3, filed on Jan. 7, 2019, the entire contents of which are incorporated herein by reference.

TECHNICAL FIELD

The present disclosure relates to the field of display technologies, and in particular, to an array substrate and a fabricating method thereof, a reflective display panel, and a display device.

BACKGROUND

In the current reflective liquid crystal display product, in order to increase the viewing angle, a convex and concave structure is disposed on the insulating layer under the pixel electrode to form protrusions and recesses on the surface of the pixel electrode, thus achieving a diffuse reflection effect. However, on the one hand, the thickness at the recess of the insulating layer is too small; on the other hand, due to the limitation of the process conditions, the thicknesses at the recesses of the corresponding insulating layer between adjacent pixels is difficult to be completely the same, and thus it easily presents a difference of the display effect between adjacent frames of the same pixel, and the display effect between adjacent pixels, thus causing a flicker phenomenon.

SUMMARY

The present disclosure provides an array substrate and a fabricating method thereof, a reflective display panel, and a display device.

The present disclosure provides an array substrate including a base on which pixel electrodes, gate lines, data lines, and thin film transistors are disposed. The data lines and the gate lines are alternately arranged to define a plurality of pixel units. Both the pixel electrodes and the thin film transistors are in one-to-one correspondence with the pixel units. An insulating layer is disposed between the pixel electrodes and a layer where a data pattern is located. The data pattern includes the data lines and source electrodes of the thin film transistors. The pixel electrodes overlap with a portion of the data pattern. A plurality of recesses are disposed on the insulating layer, and an orthographic projection of the recess on the base is located outside of an orthographic projection of an overlapping region of the pixel electrode and the data pattern on the base.

In some arrangements, the pixel electrode overlaps with a portion of the data line.

In some arrangements, the orthographic projection of the recess on the base does not overlap with an orthographic projection of the data line on the base.

In some arrangements, the orthographic projection of the recess on the base is outside of an orthographic projection of the thin film transistor on the base.

In some arrangements, the pixel electrode is a reflective electrode.

In some arrangements, there is a row spacing region between every two adjacent rows of pixel electrodes, and there is a column spacing region between every adjacent two columns of pixel electrodes, a cross region of the row spacing region and the column spacing region is a spacer region. The orthographic projection of the recess on the base is outside of an orthographic projection of at least a portion of the spacer region on the base.

The present disclosure further provides a reflective display panel including: an array substrate, a cell substrate, and a liquid crystal layer between the array substrate and the cell substrate. The array substrate adopts the above-mentioned array substrate.

In some arrangements, the pixel electrode is a reflective electrode, and the recess on the insulating layer is configured such that light having an angle between 25° and 35° with respect to a thickness direction of the reflective display panel is incident on the reflective display panel, and then is reflected by the pixel electrode in a thickness direction of the reflective display panel.

In some arrangements, the recess has a slope angle between 9° and 12°, and the slope angle is an angle between a cut surface at a midpoint of a bottom end and a top end of a sidewall of the recess, and a display surface of the reflective display panel.

The present disclosure also provides a display device including the above-mentioned reflective display panel.

The present disclosure further provides a fabricating method of the above-mentioned array substrate. The method includes forming a pattern comprising gate lines on the base. The method includes forming a data pattern, the data pattern comprising data lines and source electrodes of thin film transistors, and the gate lines and the data lines are alternately arranged to define a plurality of pixel units. The method includes forming an insulating layer. The method includes forming a plurality of recesses on the insulating layer. The method includes forming a pattern including pixel electrodes, the pixel electrodes overlapping with a portion of the data pattern, and an orthographic projection of the recess on the base being outside of an orthographic projection of an overlapping region of the pixel electrode and the data pattern on the base.

In some arrangements, the insulating layer is made of photoresist, and the insulating layer includes a first region, a second region, and a third region outside of the first region and the second region, the first region being a region where a via hole is to be formed, and the second region being a region where the recess is to be formed. Forming the plurality of recesses on the insulating layer includes: exposing the insulating layer by using a mask plate. The mask plate includes a transmitting region, a semi-transmitting region and a non-transmitting region. When the insulating layer is made of a positive photoresist, the transmitting region of the mask plate corresponds to the first region, the semi-transmitting region of the mask plate corresponds to the second region, and the non-transmitting region of the mask plate corresponds to the third region. When the insulating layer is made of a negative photoresist, the non-transmitting region of the mask plate corresponds to the first region, the semi-transmitting region of the mask plate corresponds to the second region, and the transmitting region of the mask plate corresponding to the third region. Forming the plurality of recesses on the insulating layer includes developing the exposed insulating layer to form the via hole and the plurality of recesses.

BRIEF DESCRIPTION OF THE DRAWINGS

The drawings are intended to provide a further understanding of the present disclosure, and constitute part of the specification to interpret the present disclosure in combination with the following specific implementations; however, they do not constitute limitation of the present disclosure. In the drawings.

DETAILED DESCRIPTION

The specific arrangements of the present disclosure will be described in detail below with reference to the accompanying drawings. It should be understood that the specific arrangements described herein are merely illustrative of the present disclosure, and are not intended to limit the present disclosure.

Figure 1:
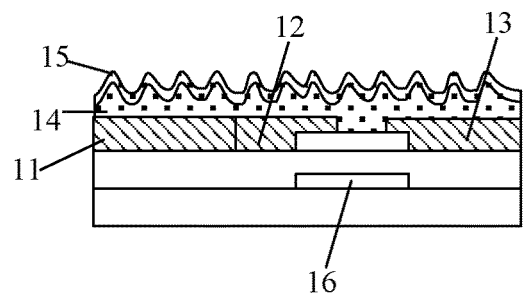
FIG. 1 is a schematic structural view of an array substrate in the prior art.

FIG. 1 is a schematic structural view of an array substrate in the prior art. As shown in FIG. 1, the data line 11 is disposed in the same layer as the source electrode 12 and the drain electrode 13 of the thin film transistor, and an insulating layer 14 is disposed between the pixel electrode 15 and both the data line 11 and the source electrode 12. Further, the pixel electrode 15 is overlapped with both the data line 11 and the source electrode 12 of the thin film transistor. The overlapping portion of the pixel electrode 15 with the data line 11 and the source electrode 12 may form a parasitic capacitance, and the overlapping portion of the pixel electrode 15 and the gate electrode 16 may also form a parasitic capacitance.

Figure 2:
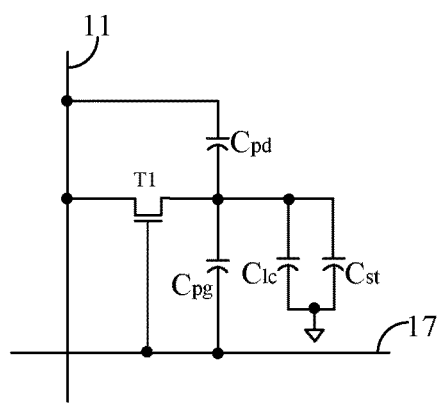
FIG. 2 is a schematic view of an equivalent circuit in a pixel unit.

FIG. 2 is a schematic view of an equivalent circuit in a pixel unit. As shown in FIG. 1 and FIG. 2, the gate electrode 16 of the thin film transistor T1 is connected to the gate line 17, and the source electrode is connected to the data line 11. $C_{pd}$ is a parasitic capacitance generated by overlapping the pixel electrode 15 with the data line 11 and the source electrode 12; $C_{pg}$ is a parasitic capacitance generated by the pixel electrode 15 and the gate electrode 16 of the thin film transistor; $C_{st}$ is a storage capacitor; and $C_{lc}$ is a liquid crystal capacitor. When two frames of pictures are switched, the pixel signal on the pixel electrode 15 is influenced by the data signal on the data line 11, the degree of influence is represented by $\Omega_{pd}$, which is calculated according to the following formula (1) and formula (2):

$$\Delta V_{pd} = \frac{C_{pd}}{C_{st} + C_{lc} + C_{pg} + C_{pd}} (V_{dh} - V_{dl}) \quad (1)$$

$$\Omega_{pd} = \Delta V_{pd\_max} - \Delta V_{pd\_min} \quad (2)$$

where $V_{dh}$ and $V_{dl}$ are respectively data signals received by the pixel unit in two adjacent frames of pictures, and $\Delta V_{pd}$ is a variation of the parasitic voltage between the pixel electrode and the data line; the adjacent two frames of pictures are positive and negative frames of pictures, that is, with regard to any pixel unit, signals in the adjacent two frames to be supplied to the pixel electrode are: a signal larger than the common voltage and a signal smaller than the common voltage; in addition, due to the influence of the parasitic capacitance $C_{pd}$, the dielectric constant after deflection of the liquid crystal may change when two adjacent frames of pictures are displayed, so that the value of $\Delta V_{pd}$ may be obtained according to the formula (1) when two adjacent frames of pictures are displayed, and $\Delta V_{pd\_max}$ and $\Delta V_{pd\_min}$ in the formula (2) is the maximum and minimum values of the plurality of $\Delta V_{pd}$, respectively.

For reflective display products, a plurality of recesses are typically formed on the insulating layer 14 to allow the insulating layer 14 to diffusely reflect external light, thus increasing the viewing angle of the display product without adding any structure. According to the calculation formula of the capacitance (i.e., $C=\varepsilon_0 \ast \varepsilon_r \ast S/d$, where $\varepsilon_0$ is the vacuum dielectric constant, $\varepsilon_r$ is the relative dielectric constant of the dielectric layer, S is the effective area of the capacitor, and d is the thickness of the dielectric layer), the smaller the thickness of the dielectric layer in the capacitor is, the larger the value of the capacitor is. Accordingly, when recesses are formed on the insulating layer 14, the parasitic capacitances at the recesses are large; and due to limitations of the process conditions, it is difficult to achieve the same thickness of the insulating layer 14 at different recesses, so that there is a large difference in the parasitic capacitances corresponding to different recesses once the thicknesses of the insulating layer 14 at different recesses slightly change.

According to the above formulas (1) and (2), when the difference in the parasitic capacitances $C_{pd}$ corresponding to two adjacent pixel units is larger, the difference in $\Omega_{pd}$ corresponding to the two pixel units is larger, resulting in inconsistent bright/dark states of the two pixel units, and thus causing flicker. On the other hand, for the same pixel unit, since the parasitic capacitance $C_{pd}$ itself generated by the pixel electrode in the pixel unit and the data line and source electrode are larger, the variation of parasitic voltage between the pixel electrode and the data line is larger when the positive and negative frames of pictures are switched, and the signal of the data line interferes with the signal of the pixel electrode, thus causing a larger difference in display brightness of the same pixel unit in two adjacent frames, and also causing flicker.

Figure 3:
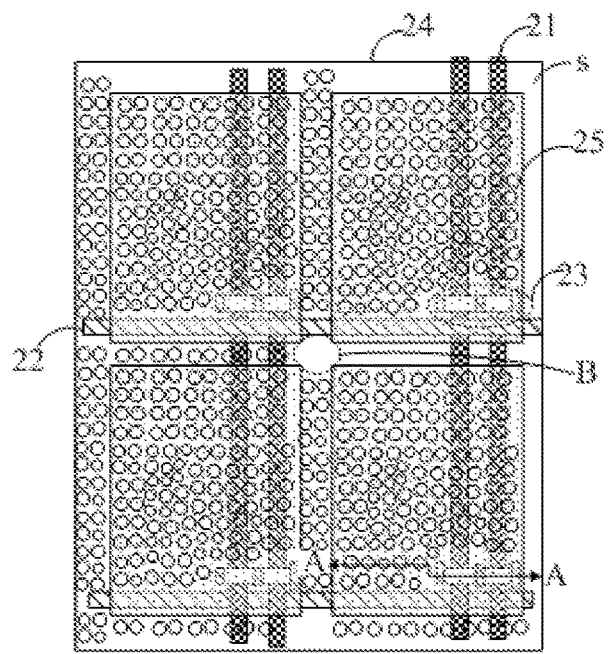
FIG. 3 is a top view of an array substrate according to an arrangement of the present disclosure.
Figure 4:
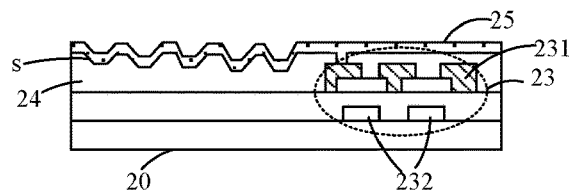
FIG. 4 is a cross-sectional view taken along line A-A of FIG. 3.

FIG. 3 is a top view of an array substrate according to an arrangement of the present disclosure, and FIG. 4 is a cross-sectional view taken along line A-A of FIG. 3. As shown in FIG. 3 and FIG. 4, the array substrate includes a base 20 on which pixel electrodes 25, gate lines 21, data lines 22, and thin film transistors 23 are disposed. The gate lines 21 and the data lines 22 are alternately arranged to define a plurality of pixel units. The pixel electrodes 20 are in one-to-one correspondence with the pixel units, and the thin film transistors 23 are in one-to-one correspondence with the pixel units. An insulating layer 24 is disposed between the pixel electrodes 25 and a layer where the data pattern is located. The data pattern includes data lines 22 and source electrodes of the thin film transistors 23, and the data lines 22 and the source electrodes 231 of the thin film transistor 23s may be disposed in the same layer. The pixel electrode 25 overlaps with a portion of the data pattern. The insulating layer 24 is provided with a plurality of recesses s, and an orthographic projection of the recess s on the base 20 is outside of an orthographic projection of the overlapping region of the pixel electrode 25 and the data pattern on the base 20. The term "overlapping" in the present disclosure means that two patterns are located in different layers, and the orthographic projections of these two patterns are overlapped on the base.

It should be noted that, in FIG. 3, in order to identify the position of the recess s, the region covered by the pixel electrode 25 may also indicate the recess s, however, it does not mean that the pixel electrode 25 must be transparent.

In the present disclosure, the orthographic projection of the recess s of the insulating layer 24 on the base 20 is outside of the orthographic projection of the overlapping region of the pixel electrode 25 and the data pattern on the base 20, i.e., when the pixel electrode 25 is overlapped with the data line 22, no recess s is provided on the portion of the insulating layer 24 corresponding to the overlapping region of the pixel electrode 25 and the data line 22; when the pixel electrode 25 and the source electrode 231 are overlapped, no recess s is provided on the portion of the insulating layer 24 corresponding to the overlapping region of the pixel electrode 25 and the source electrode. Therefore, compared to the prior art, the parasitic capacitance $C_{pd}$ between the pixel electrode 25 and the data pattern in the present disclosure is decreased. In this case, since the parasitic capacitance $C_{pd}$ itself is smaller, for the same pixel unit, the parasitic voltage variation $\Delta V_{pd}$ is smaller when positive and negative frames are switched, so that the interference of the data line signal on the pixel electrode signal is reduced, and the display effects of the pixel unit in adjacent two frames of pictures are similar so as to improve the flicker phenomenon; on the other hand, for two adjacent pixel units, even if the thicknesses of different positions of the insulating layer 24 are inconsistent due to process problems, there would not be an excessive difference between the parasitic capacitances $C_{pd}$ of the two pixel units, reducing the display difference between different pixel units, and thus improving the flicker phenomenon.

The thickness of the portion of the insulating layer 24 where no recess s is provided is no less than 1.5 μm, and the thickness of the insulating layer 24 at the bottom position of the recess s is no less than 1.0 μm but smaller than the thickness of the portion where no recess s is provided.

The array substrate of the arrangement is particularly suitable for a reflective display panel. In this case, the pixel electrode 25 is a reflective electrode for reflecting ambient light or light from the front light source. The recess s provided on the insulating layer 24 causes the surface of the pixel electrode 25 to form a diffuse reflection surface, thus increasing the viewing angle. The reflective electrode may be a total reflection electrode or a transflective electrode.

Further, as shown in FIG. 3, the pixel electrode 25 overlaps with a portion of the data line 22 to increase the coverage area of the pixel electrode 25, i.e., to increase the reflection area, thus increasing the aperture ratio of the pixel unit. At this time, there is no recess s provided in the portion of the insulating layer 24 corresponding to the overlapping region of the pixel electrode 25 and the data line 22.

Still further, the orthographic projection of the recess s on the base 20 does not overlap with the orthographic projection of the data line 22 on the base 20. That is, there is no recess s provided in the region where the entire data line 22 is located.

In addition, the orthographic projection of the recess s on the base 20 is outside of the orthographic projection of the thin film transistor 23 on the base 20. That is, there is no recess s provided in the portion of the insulating layer 24 corresponding to the region where the whole thin film transistor 23 is located, reducing the parasitic capacitance between the pixel electrode 25 and the gate electrode 232 to decrease the influence of the parasitic capacitance between the pixel electrode 25 and the gate electrode 232 on the display effect.

As shown in FIG. 3, each pixel unit corresponds to two gate lines 21 and one data line 22, and the thin film transistor 23 in each pixel unit may be a dual gate thin film transistor, and two gate electrodes 232 of the dual gate thin film transistor are respectively connected to the two gate lines 21 corresponding to the pixel unit. Of course, each pixel unit may also correspond to one gate line 21 and one data line 22.

In addition, the thin film transistor 23 of the present disclosure may be a bottom gate type thin film transistor or a top gate type thin film transistor.

In addition, there are a row spacing region between every two adjacent rows of pixel electrodes and a column spacing region between every two adjacent columns of pixel electrodes. A cross region of the row spacing region and the column spacing region is a spacer region B, at least a part of which is used to provide a spacer, so that the spacer is capable of maintaining the cell thickness of the display panel when the array substrate is used in the display panel. To facilitate stability of support of the spacer, the projection of the recess s on the base 20 may also be outside of the orthographic projection of at least a portion of the spacer region B on the base 20. Preferably, the projection of the recess s on the base 20 is outside of the orthographic projection of all of the spacer region B on the base 20, i.e., there is no recess s provided in the portion of the insulating layer 24 corresponding to the spacer region B.

Another arrangement of the present disclosure provides a reflective display panel including an array substrate, a cell substrate, and a liquid crystal layer between the array substrate and the cell substrate. The array substrate is the array substrate in the above arrangement. The reflective display panel may be a total reflection display panel or a transflective display panel.

The recess s on the insulating layer 24 in FIG. 4 is configured such that light having an angle between 25° and 35° with respect to a thickness direction of the reflective display panel is incident on the reflective display panel, and then is reflected by the pixel electrode 25 in a thickness direction of the reflective display panel.

Figure 5:
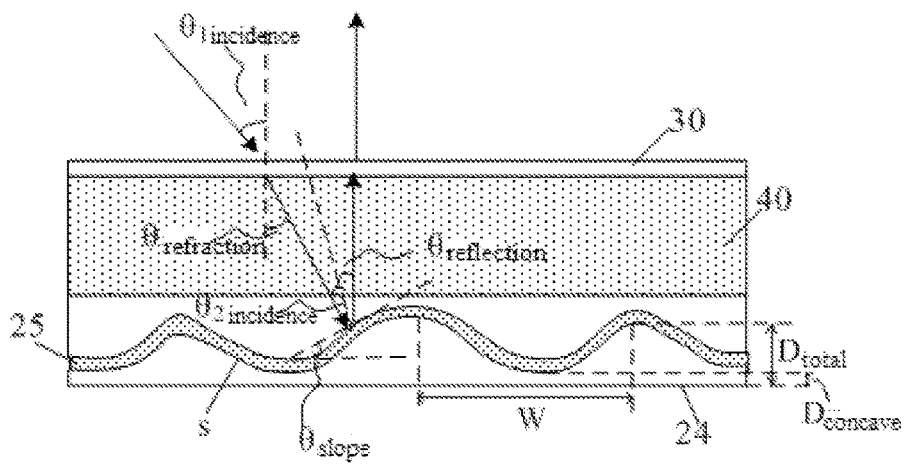
FIG. 5 is a light path diagram in which light emitted toward a pixel electrode is reflected by the pixel electrode.

FIG. 5 is a light path diagram that light emitted towards a pixel electrode is reflected by the pixel electrode. An incident angle and a reflection angle of the light satisfy the following formula (3):

$$\sin\theta_{1\ incidence}/\sin\theta_{refraction}=n_{cell}/n_{air} \quad (3)$$

where $\theta_{1\ incidence}$ is an incident angle when external light is incident on the surface of the reflective display panel; $\theta_{refraction}$ is a refraction angle when the light is refracted on the surface of the reflective display panel; $n_{cell}$ is an overall refractive index of the reflective display panel; and $n_{air}$ is an air refractive index. It should be noted that the cell substrate 30 may include a multi-layer structure, and the array substrate further includes a multi-layer structure above the insulating layer 24. Since the refractive index of these layer structures and the refractive index of the liquid crystal layer 40 are not necessarily identical, multiple refractions may occur as the external light enters the reflective display panel until it irradiates onto the pixel electrode 25, and $n_{cell}$ is a refractive index of a dielectric layer having a uniform refractive index, to which dielectric layer the cell substrate 30, the liquid crystal layer 40, and the multi-layer structure of the array substrate above the insulating layer 24 are equivalent to; the $\theta_{refraction}$ is the refraction angle when the light enters the equivalent dielectric layer.

According to the above formula (3):

$$\theta_{refraction} = \arcsin(\sin\theta 1_{incidence} * n_{air}/n_{cell}) \quad (4)$$

It is assumed that an angle $\theta_{slope}$ between the display surface and a tangent plane at the midpoint of the bottom end and the top end of the sidewall of the recess s is taken as the slope angle of the recess s (the bottom end of the sidewall of the recess s is an end that is close to the base, the top end of the recess s is an end away from the base; and the slope angle of the recess s is also the slope angle of the protrusion between adjacent recesses s). Thus, in order to satisfy that a direction in which the light is reflected by the pixel electrode 25 is the thickness direction of display panel, the slope angle θ of the recess s is:

$$\theta_{slope} = \theta_{2\ incidence} = \theta_{reflection} = \theta_{refraction}/2 \quad (5)$$

where $\theta_{2\ incidence}$ is an incident angle at which the light is irradiated to the pixel electrode 25, and $\theta_{reflection}$ is a reflection angle at which the light is reflected by the pixel electrode 25.

The slope angle of the recess s may be calculated by the above formulas (4) and (5), and the relationship among the total thickness $D_{total}$ of the insulating layer 24, the thickness $D_{concave}$ of the insulating layer 24 at the bottom of the recess s, and the diameter W of the recess s may be calculated according to the following formula (6):

$$\tan\theta_{slope} = (D_{total} - D_{concave})/(W/2) \quad (6)$$

In the present disclosure, in particular, the slope angle $\theta_{slope}$ of the recess s is between 9° and 12°.

Table 1 shows test data for the reflective display panel of the present disclosure and the reflective display panel of the prior art. In the existing reflective display panel, other portions of the insulating layer are provided with recesses in addition to the spacer region B in FIG. 3; and in the reflective display panel of the present disclosure, there is no recess provided in the portion of the insulating layer 24 corresponds to the thin film transistor 23, the portion corresponding to the data line 22, and the portion corresponding to the spacer region B, and all of the remaining regions are provided with recesses. Further, in two kinds of reflective display panels, the dimension and distribution density of the recesses s are same in the regions where the recesses s are provided.

TABLE 1

| Item | | Prior Art | Present Disclosure |
|---|---|---|---|
| Reflectance | DP | 56% | 56% |
| | DO | 59% | 58% |
| | L | 42% | 40% |
| | R | 43% | 42% |
| Contrast Ratio | DP | 27.9 | 27.8 |
| | DO | 26.2 | 26.2 |
| | L | 19.7 | 18.8 |
| | R | 14.7 | 14.9 |
| Degree of flicker | DP | 12.9% | 1.5% |
| | DO | 36.2% | 1.7% |
| | L | 20.0% | 9.7% |
| | R | 30.9% | 11.4% |

The data in Table 1 include reflectances, contrast ratios, and degrees of flicker of two reflective display panels. In the table, the reflectance is used to characterize the brightness of the reflective display panel in the reflective state (i.e., when the external light is reflected); the contrast ratio is a ratio of the brightness when a white screen is displayed (the brightest) to the brightness when the black screen is displayed (the darkest); and the degree of flicker is a degree of change for brightness and darkness of the display panel. Specifically, the brightness of the display panel may be detected once per unit time (for example, 1 second), so that the ratio of the amount of change of the plurality of brightness values detected during a detection period to the average value of the plurality of brightness values is the degree of flicker of the reflective display panel. DP in Table 1 represents data detected from the bonding side of the reflective display panel, DO represents data detected from the opposite side of the binding side, L represents data detected from the left side of the reflective display panel, and R represents data detected from the right side of the reflective display panel. The greater the percentage value corresponding to the degree of flicker is, the more severe the flicker is. As can be seen from the comparison, compared with the existing reflective display panel, the reflective display panel of the present disclosure has almost no change in light reflectance and contrast ratio, and the degree of flicker is greatly reduced.

The reflective display panel of the present arrangement adopts the array substrate of the previous arrangement. Since the parasitic capacitance $C_{pd}$ between the pixel electrode and the data line and source electrode in the array substrate is reduced, the variation of the parasitic voltage of the pixel unit is smaller when positive and negative frames are switched, so that the display effect of the same pixel unit in the adjacent two frames is similar; and when the parasitic capacitance $C_{pd}$ is decreased, the difference of the parasitic capacitances of the adjacent two pixel units is also reduced, so that the display effects of the two adjacent pixel units are also similar. Thus, the flicker defect of the reflective display panel can be improved, and the test results show that the reflectance of the reflective display panel is almost unchanged.

In yet another arrangement of the present disclosure, a display device using the reflective display panel of the above arrangement is provided, so that the display defect can be improved and the display effect of the display device can be improved in the case of ensuring the reflectance.

The display device of the arrangement may be any product or component having a display function, such as an electronic paper, a mobile phone, a tablet computer, a television, a display, a notebook computer, a navigator, or the like, and the display device of the arrangement may be a total reflection display device or a transflective display device, which may especially be an electronic label product.

Figure 6:
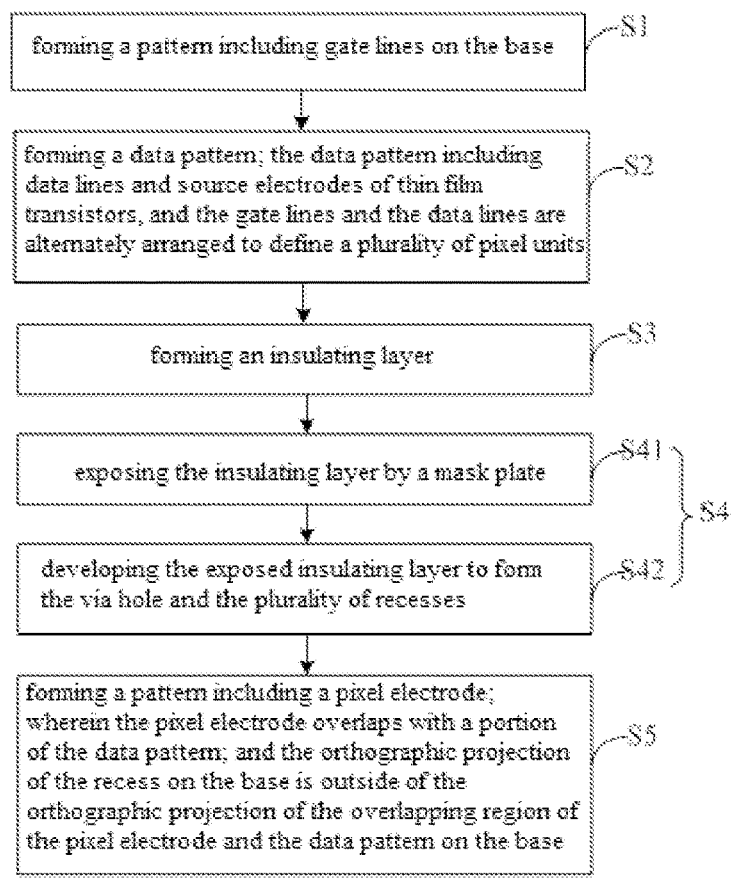
FIG. 6 is a flow chart of a method for fabricating an array substrate according to an arrangement of the present disclosure.

FIG. 6 is a flow chart of a fabricating method of an array substrate, according to a still another arrangement of the present disclosure, which method is used to fabricate the array substrate in the previous arrangement. As shown in FIG. 6, the fabricating method of the array substrate includes blocks:

Block S1: forming a pattern including gate lines on the base.

Block S2: forming a data pattern; the data pattern including data lines and source electrodes of thin film transistors, and the gate lines and the data lines are alternately arranged to define a plurality of pixel units. The thin film transistor may be a bottom gate type thin film transistor or a top gate type thin film transistor.

Block S3: forming an insulating layer.

Block S4: forming a plurality of recesses on the insulating layer.

Block S5: forming a pattern including a pixel electrode. The pixel electrode overlaps with a portion of the data pattern; and the orthographic projection of the recess on the base is outside of the orthographic projection of the overlapping region of the pixel electrode and the data pattern on the base. The pixel electrode may be made of a metal material to form a reflective electrode.

Specifically, the insulating layer is made of photoresist. The insulating layer specifically includes a first region, a second region, and a third region outside of the first region and the second region. The first region is a region where a via hole is to be formed, and the photoresist of the first region is completely removed in block S4, thus forming the via hole, and the pixel electrode is connected to the drain electrode of the thin film transistor through the via hole. The region of the insulating layer corresponding to the bonding region of the array substrate may also be regarded as the region where the via hole is to be formed. The second region is a region where the recess is to be formed, and the photoresist of the second region is partially removed in block S4, thus forming the recess.

Block S4 includes blocks:

Block S41: exposing the insulating layer by a mask plate. The mask plate includes a transmitting region, a semi-transmitting region and a non-transmitting region. When the insulating layer is made of a positive photoresist, the transmitting region of the mask plate corresponds to the first region, the semi-transmitting region of the mask plate corresponds to the second region, and the non-transmitting region of the mask plate corresponds to the third region. When the insulating layer is made of a negative photoresist, the non-transmitting region of the mask plate corresponds to the first region, and the semi-transmitting region of the mask plate corresponds to the second region, and the transmitting region of the mask plate corresponds to the third region.

Block S42: developing the exposed insulating layer to form the via hole and the plurality of recesses.

It should to be understood that the above arrangements are merely exemplary arrangements used to explain the principle of the present disclosure, but the present disclosure is not limited thereto. Various modifications and improvements can be made by those skilled in the art without departing from the spirit and scope of the present disclosure, and such modifications and improvements are also considered to be within the scope of the present disclosure.

What is claimed is:

1. An array substrate, comprising:
a base on which pixel electrodes, gate lines, data lines, and thin film transistors are disposed, the data lines and the gate lines being alternately arranged to define a plurality of pixel units, and both the pixel electrodes and the thin film transistors being in one-to-one correspondence with the pixel units;
an insulating layer disposed between the pixel electrodes and a layer where a data pattern is located, wherein the data pattern comprises the data lines and source electrodes of the thin film transistors, the pixel electrodes overlap with a portion of the data pattern, the pixel electrodes are connected to drain electrodes of the thin film transistors through via holes, and the pixel electrodes overlap at least part of each of the data lines and overlap the drain electrodes and the source electrodes;
a plurality of recesses disposed on the insulating layer, wherein an orthographic projection of one of the recesses on the base is outside of an orthographic projection of an overlapping region of one of the pixel electrodes and the data pattern on the base; and
wherein a row spacing region exists between every two adjacent rows of pixel electrodes, a column spacing region exists between every adjacent two columns of pixel electrodes, a cross region of the row spacing region and the column spacing region is a spacer region, and an orthographic projection of the spacer region does not overlap with orthographic projections of the data lines and the gate lines.

2. The array substrate according to claim 1, wherein the one of the pixel electrodes overlaps with a portion of one of the data lines.

3. The array substrate according to claim 1, wherein the orthographic projection of the one of the recesses on the base does not overlap with an orthographic projection of one of the data lines on the base.

4. The array substrate according to claim 1, wherein the orthographic projection of the one of the recesses on the base is outside of an orthographic projection of one of the thin film transistors on the base.

5. The array substrate according to claim 1, wherein each of the pixel electrodes is a reflective electrode.

6. The array substrate according to claim 1, wherein:
the orthographic projection of one of the recesses on the base is outside of an orthographic projection of at least a portion of the spacer region on the base.

7. The array substrate according to claim 1, wherein the array substrate is part of a reflective display panel, the reflective display panel comprising the array substrate, a cell substrate, and a liquid crystal layer between the array substrate and the cell substrate.

8. The array substrate according to claim 7, wherein each of the pixel electrodes is a reflective electrode, and each of the recesses on the insulating layer is configured such that: light having an angle between 25° and 35° with respect to a thickness direction of the reflective display panel is incident on the reflective display panel, and then is reflected by one of the pixel electrodes in the thickness direction of the reflective display panel.

9. The array substrate according to claim 7, wherein each of the recesses has a slope angle between 9° and 12°, and the slope angle is an angle between a cut surface at a midpoint of a bottom end and a top end of a sidewall of the recess, and a display surface of the reflective display panel.

10. The array substrate according to claim 7, wherein the reflective display panel is part of a display device.

11. The array substrate according to claim 10, wherein each of the pixel electrodes is a reflective electrode, and each of the recesses on the insulating layer is configured such that: light having an angle between 25° and 35° with respect to a thickness direction of the reflective display panel is incident on the reflective display panel, and then is reflected by one of the pixel electrodes in the thickness direction of the reflective display panel.

12. The array substrate according to claim 10, wherein each of the recesses has a slope angle between 9° and 12°, and the slope angle is an angle between a cut surface at a midpoint of a bottom end and a top end of a sidewall of the recess, and a display surface of the reflective display panel.

13. A method of fabricating the array substrate according to claim 1, comprising:
forming a pattern comprising gate lines on the base;
forming a data pattern, the data pattern comprising data lines and source electrodes of thin film transistors, and the gate lines and the data lines are alternately arranged to define a plurality of pixel units;
forming an insulating layer;
forming a plurality of recesses on the insulating layer; and
forming a pattern including pixel electrodes, the pixel electrodes overlapping with a portion of the data pattern, and an orthographic projection of one of the recesses on the base being outside of an orthographic projection of an overlapping region of one of the pixel electrodes and the data pattern on the base.

14. The method according to claim 13, wherein the insulating layer is made of photoresist, and the insulating layer comprises a first region, a second region, and a third region outside of the first region and the second region, the first region being a region where a via hole is to be formed, and the second region being a region where the one of the recesses is to be formed;

forming the plurality of recesses on the insulating layer comprises:
exposing the insulating layer by using a mask plate, wherein the mask plate comprises a transmitting region, a semi-transmitting region and a non-transmitting region, when the insulating layer is made of a positive photoresist, the transmitting region of the mask plate corresponding to the first region, the semi-transmitting region of the mask plate corresponding to the second region, and the non-transmitting region of the mask plate corresponding to the third region, and when the insulating layer is made of a negative photoresist, the non-transmitting region of the mask plate corresponding to the first region, the semi-transmitting region of the mask plate corresponding to the second region, and the transmitting region of the mask plate corresponding to the third region; and
developing the exposed insulating layer to form the via hole and the plurality of recesses.

15. A display device comprising a reflective display panel, the reflective display panel comprising:
an array substrate, a cell substrate, and a liquid crystal layer between the array substrate and the cell substrate, wherein the array substrate comprises:
a base having a plurality of pixel electrodes, a plurality of gate lines, a plurality of data lines, and a plurality of thin film transistors disposed thereon, wherein the data lines and the gate lines are alternately arranged to provide a plurality of pixel units, and both the pixel electrodes and the thin film transistors are in a one-to-one correspondence with the pixel units;
an insulating layer disposed between the pixel electrodes and a layer where a data pattern is located, wherein the data pattern comprises the data lines and source electrodes of the thin film transistors, the pixel electrodes overlap with a portion of the data pattern, the pixel electrodes are connected to drain electrodes of the thin film transistors through via holes, and the pixel electrodes overlap at least part of each of the data lines and overlap the drain electrodes and the source electrodes;
a plurality of recesses disposed on the insulating layer, wherein an orthographic projection of one of the recesses on the base is outside of an orthographic projection of an overlapping region of one of the pixel electrodes and the data pattern on the base; and
wherein a row spacing region exists between every two adjacent rows of pixel electrodes, a cross region of the row spacing region and the column spacing region is a spacer region, and an orthographic projection of the spacer region does not overlap with orthographic projections of the data lines and the gate lines.

16. The display device according to claim 15, wherein each of the pixel electrodes is a reflective electrode, and each of the recesses on the insulating layer is configured such that: light having an angle between 25° and 35° with respect to a thickness direction of the reflective display panel is incident on the reflective display panel, and then is reflected by one of the pixel electrodes in the thickness direction of the reflective display panel.

17. The display device according to claim 15, wherein each of the recesses has a slope angle between 9° and 12°, and the slope angle is an angle between a cut surface at a midpoint of a bottom end and a top end of a sidewall of the recess, and a display surface of the reflective display panel.

* * * * *